US008013657B2

(12) United States Patent
Tsai et al.

(10) Patent No.: US 8,013,657 B2
(45) Date of Patent: Sep. 6, 2011

(54) TEMPERATURE COMPENSATED INTEGRATOR (75) Inventors: Tsung-Hsien Tsai, Hsinchu (TW); Min-Shueh Yuan, Taipei (TW); Chien-Hung Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/575,222

(22) Filed: Oct. 7, 2009

(65) Prior Publication Data
US 2011/0080220 A1   Apr. 7, 2011

(51) Int. Cl.
*H03K 5/00*   (2006.01)
(52) U.S. Cl. ......... 327/337; 327/552; 327/554; 327/558
(58) Field of Classification Search .......... 327/336–337, 327/362, 551–559
See application file for complete search history.

(56) References Cited

U.S. PATENT DOCUMENTS

| 5,134,885 A * | 8/1992 | Hecht et al. ..................... 73/708 |
| 6,304,128 B1 * | 10/2001 | Shulman ....................... 327/345 |
| 6,603,110 B2 * | 8/2003 | Hayami et al. ............ 250/214 R |

OTHER PUBLICATIONS

Schaumann, Rolf and Van Valkenburg, Mac E., "Design of Analog Filters," © 2001 by Oxford University Press, pp. 136-161.

* cited by examiner

*Primary Examiner* — Dinh T. Le
(74) *Attorney, Agent, or Firm* — Duane Morris LLP (57) ABSTRACT A representative integrator includes an amplifier having an input and an output; a feedback loop coupled between the input and the output of the amplifier, the feedback loop comprising a compensated resistor circuit having a resistance value selected for reducing a loss factor of the integrator; and a control circuit coupled to an input of the compensated resistor circuit, the control circuit producing a control signal for controlling the compensated resistor circuit to substantially maintain the resistance value selected for reducing the loss factor of the integrator across a range of integrator temperatures.

16 Claims, 8 Drawing Sheets

TEMPERATURE COMPENSATED INTEGRATOR

TECHNICAL FIELD

The present disclosure is generally related to electrical circuits and, more particularly to temperature compensated integrators.

BACKGROUND

In theory, an integrator is lossless but in practice the integrator is not. Typically, a resistor is inserted into the integrator to reduce a loss factor q. By reducing the loss factor q, the Q value of the integrator can be optimized. Another factor that affects the loss factor q and the Q value is temperature variation of the integrator. The resistance value of the resistor changes in response to temperature variation. One previous method uses a digital-to-analog converter (DAC) to adjust the resistance value of the resistor. However, the DAC method typically matches the Q value at one temperature. If the temperature changes, the Q value of the integrator also changes.

Desirable in the art is an improved temperature compensated circuit that can improve the Q value of the integrator with temperature variation.

SUMMARY

A representative integrator includes an amplifier having an input and an output; a feedback loop coupled between the input and the output of the amplifier, the feedback loop comprising a compensated resistor circuit having a resistance value selected for reducing a loss factor of the integrator; and a control circuit coupled to an input of the compensated resistor circuit, the control circuit producing a control signal for controlling the compensated resistor circuit to substantially maintain the resistance value selected for reducing the loss factor of the integrator across a range of integrator temperatures.

The above and other features of the present invention will be better understood from the following detailed description of the preferred embodiments of the invention that is provided in connection with the accompanying drawings.

BRIEF DESCRIPTION OF DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are arranged to communicate with one another either directly or indirectly through intervening structures, unless expressly described otherwise.

Exemplary integrators are first discussed with reference to the figures. Although these integrators are described in detail, they are provided for purposes of illustration only and various modifications are feasible. After the exemplary integrators are described, examples of temperature compensated circuits of the integrators are provided.

Figure 1:
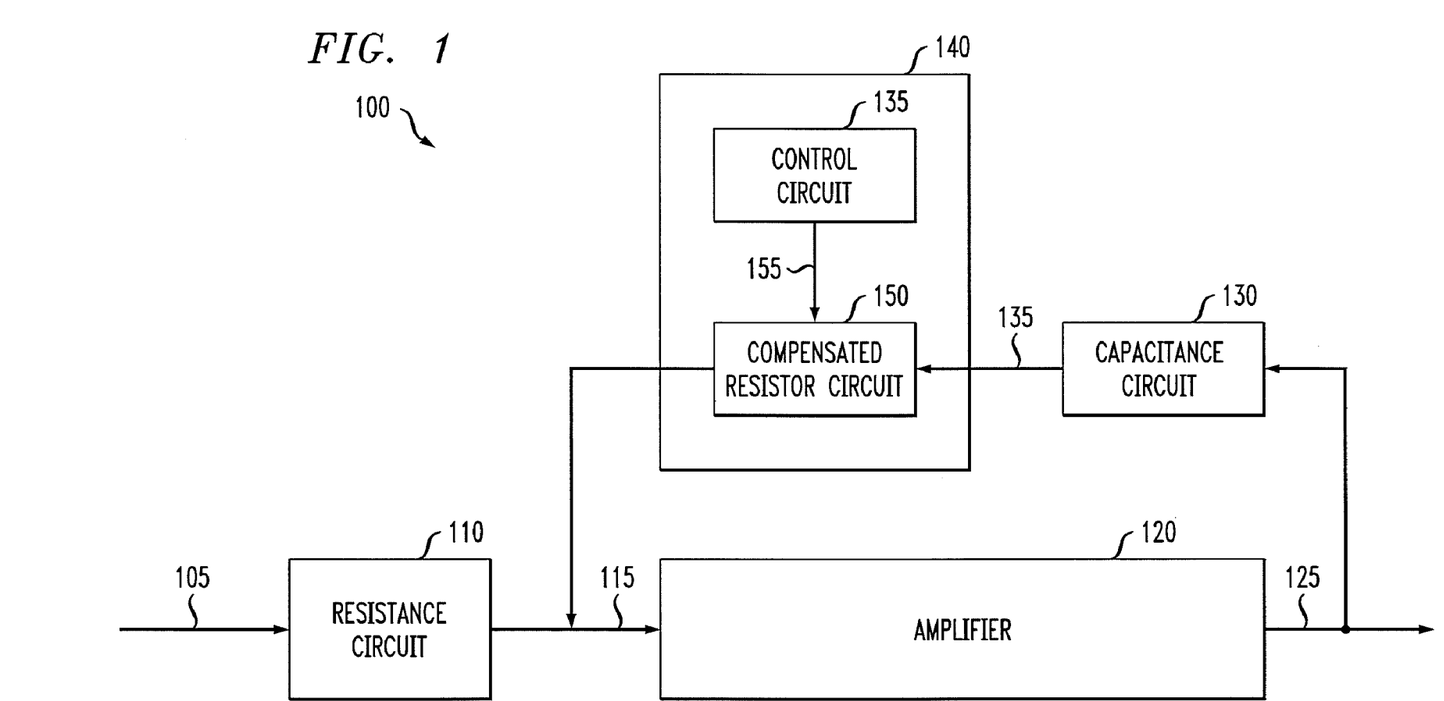
FIG. 1 is a high-level block diagram that illustrates an embodiment of an integrator having a temperature compensated circuit.

FIG. 1 is a high-level block diagram that illustrates an embodiment of an integrator 100 having a temperature compensated circuit 140. The integrator 100 includes a resistance circuit 110 that receives an input signal at line 105, and an amplifier 120 that is electrically coupled to the resistance circuit 110 and receives the input signal from the resistance circuit 110 at an input of the amplifier 120 at line 115. The amplifier 120 is designed to produce an amplified signal from the input signal.

The integrator includes a feedback loop between the output and the input of the amplifier 120. The feedback loop includes a feedback capacitance circuit 130 that is electrically coupled to and receives the amplified signal from the amplifier 120 at line 125. The feedback capacitance circuit 130 is designed to decrease a frequency response at a high frequency of the amplified signal. A temperature compensated circuit 140 is electrically coupled to the feedback capacitance circuit 130 and receives the decreased frequency response signal from the feedback capacitance circuit 130 at line 135. The temperature compensated circuit 140 is designed to match a compensated resistance value of the integrator 100 and pass the decreased frequency response signal to the input of the amplifier 120. By matching the compensated resistance value of the integrator 100, the integrator 100 becomes less lossy.

The following description provides a mathematical explanation for matching the compensated resistance value of the integrator 100. A loss factor q for the integrator 100 can be determined as follows:

$$q = \frac{\omega^2 CR}{\omega_t} \quad \text{(Eq. 1)}$$

where R and C refer to the values of the resistance circuit 110 and capacitance circuit 130, and $\omega$ and $\omega_t$ refer to the operating frequency and resonate frequency of the integrator, respectively. Based on Equation 1, if $\omega_t$ is infinite then q is zero, resulting in a lossless integrator. A Q factor for the integrator 100 can be determined using Equation 1, which is as follows:

$$Q = \frac{\omega CR}{q} = \frac{\omega_t}{\omega} \quad \text{(Eq. 2)}$$

It should be noted that an infinite Q factor means that the integrator 100 oscillates, which is not useful in a signal processing circuit. Depending on the application such as a low pass filter, a suitable Q factor can be determined in the design stage.

The loss factor q can be reduced by inserting a resistor in series with the capacitance circuit 130 based on Equation 2, which is as follows:

$$Q = \frac{\omega_t}{\omega} = \frac{1}{\omega * r * C} \Rightarrow r = \frac{1}{\omega_t C} \qquad (Eq.\ 3)$$

Depending on the determined Q factor, the compensated resistance value r can be determined to reduce the loss factor q of the integrator 100. One skilled in the art would appreciate that Equation 3 is derived using various mathematical models and assumptions in connection with the integrator 100.

Specifically, the temperature compensated circuit 140 includes a compensated resistor circuit 150 that is electrically coupled in series with the feedback capacitance circuit 130 and includes a resistance value that matches the compensated resistance value of the integrator 100. Because the resistance value of the compensated resistor circuit 150 changes based on a temperature of the integrator 100, the temperature compensated circuit 140 further includes a control circuit 135 (e.g., a negative temperature coefficient voltage generator (NTC-VG)) that produces a control signal for controlling the compensated resistor circuit 150 to substantially maintain the resistance value selected for reducing the loss factor of the integrator 100 across a range of integrator temperatures. The temperature compensated circuit 140 is further described in connection with FIGS. 2-8.

Figure 2:
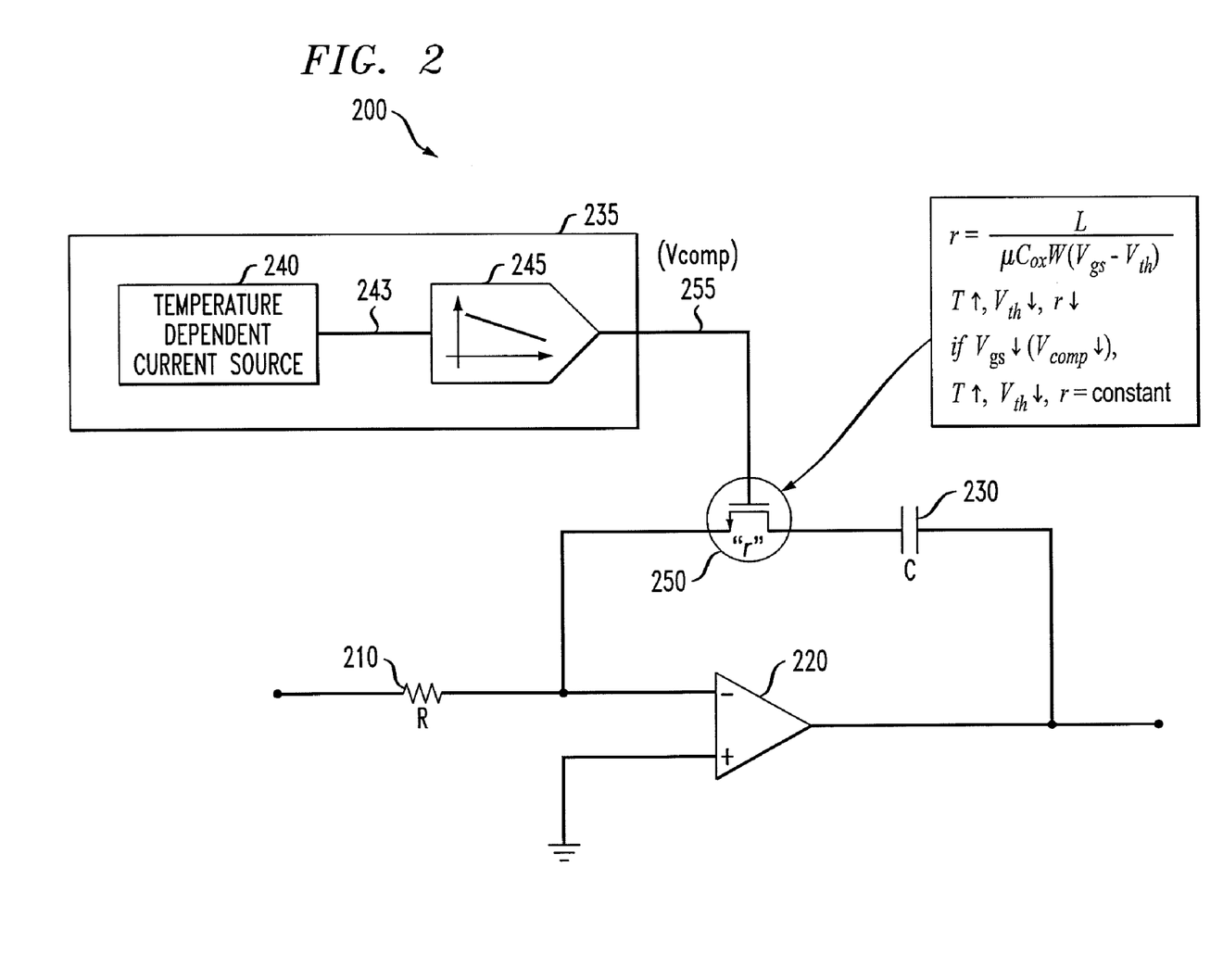
FIG. 2 illustrates an embodiment of the integrator of FIG. 1 having a temperature compensated circuit.

FIG. 2 illustrates an embodiment of an integrator 200 having a temperature compensated circuit 140. The integrator 200 includes a resistor 210 that is electrically coupled to an input of an operational amplifier 220. The integrator 200 includes a feedback loop between the output and the input of the operational amplifier 220. The feedback loop includes a capacitor 230 and transistor 250 electrically coupled in series. A control circuit 235, which includes a temperature dependent current source 240 and a current mirror circuit 245, has an output coupled via line 255 to the gate of a transistor 250, e.g., an NMOS transistor.

The temperature dependent current source 240 is electrically coupled to the current mirror circuit 245 via line 243. In embodiments, the temperature dependent current source 240 can include a proportional to absolute temperature current source and its derivates. In general, the temperature dependent current source 240 produces a reference current that changes as a temperature of the temperature dependent current source 240 changes. For example, the reference current increases with increases in the surrounding temperature and decreases with decreases in temperature. The temperature dependent current source 240 is further described in connection with FIGS. 6A-B.

The resistance value of an NMOS transistor 250 can be determined based on the following equation:

$$r = \frac{L}{\mu C_{ox} W (V_{gs} - V_{th})} \qquad (Eq.\ 4)$$

where L, W, and $\mu C_{ox}$ refer to the length, width, and thickness of the oxide layer of the NMOS transistor 250, respectively.

$V_{gs}$ and $V_{th}$, refer to the voltage between the gate and source and the threshold voltage of the NMOS transistor 250, respectively. It should be noted that the threshold voltage $V_{th}$, decreases as the temperature increases, and vice versa. Thus, the resistance value of the NMOS transistor 250 also decreases as the temperature increases, and vice versa. The resistance value of the NMOS transistor 250 can remain constant if $V_{gs}$ increases and decreases with $V_{th}$.

In this example, the $V_{gs}$ of the NMOS transistor 250 can be controlled by providing the control signal to the gate of the NMOS transistor 250. The control signal is a voltage signal $V_{comp}$ that is dependent on a temperature of the integrator 200. For example, the control circuit 235 decreases the voltage signal $V_{comp}$ at line 255 as the temperature increases such that the resistance value of the NMOS transistor 250 remains substantially constant with temperature variation across an expected range of temperatures for the integrator 200. The control circuit 235 is further described in connection with FIGS. 5, 6A-B, and 8.

Figure 3:
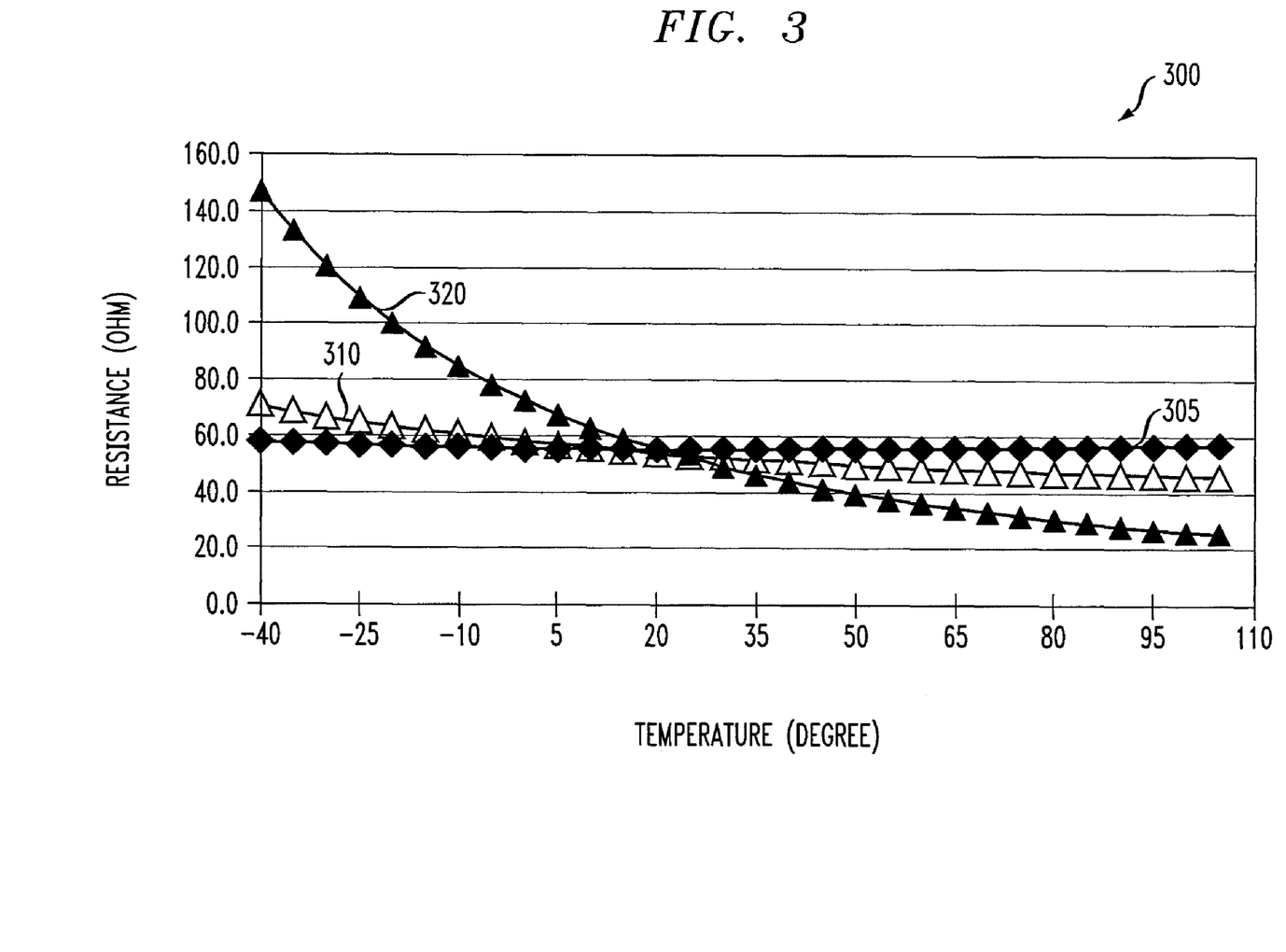
FIG. 3 is a resistance versus temperature chart that illustrates resistance values of a temperature compensated circuit of the integrator of FIG. 2.

FIG. 3 is a resistance versus temperature chart 300 that illustrates resistance values of a temperature compensated circuit 140 using a control circuit 235, such as that shown in FIG. 2. The ideal performance characteristics are shown by reference number 305. As illustrated by 305, the resistance values vary from approximately 55 to 58 ohms with temperature variation of approximately 40 to 110° C. Reference number 310 identifies the resistance values of the temperature compensated circuit 140. These resistance values vary from approximately 45 to 70 ohms. Reference number 310 shows the resistance values of a prior method using the digital-to-analog converter (DAC). These resistance values vary from approximately 20 to 150 ohms. As can be seen from FIG. 3, the temperature compensated circuit 140 using the control circuit 235 produces resistance values that more closely resemble the ideal resistance values 305 than the prior method.

Figure 4:
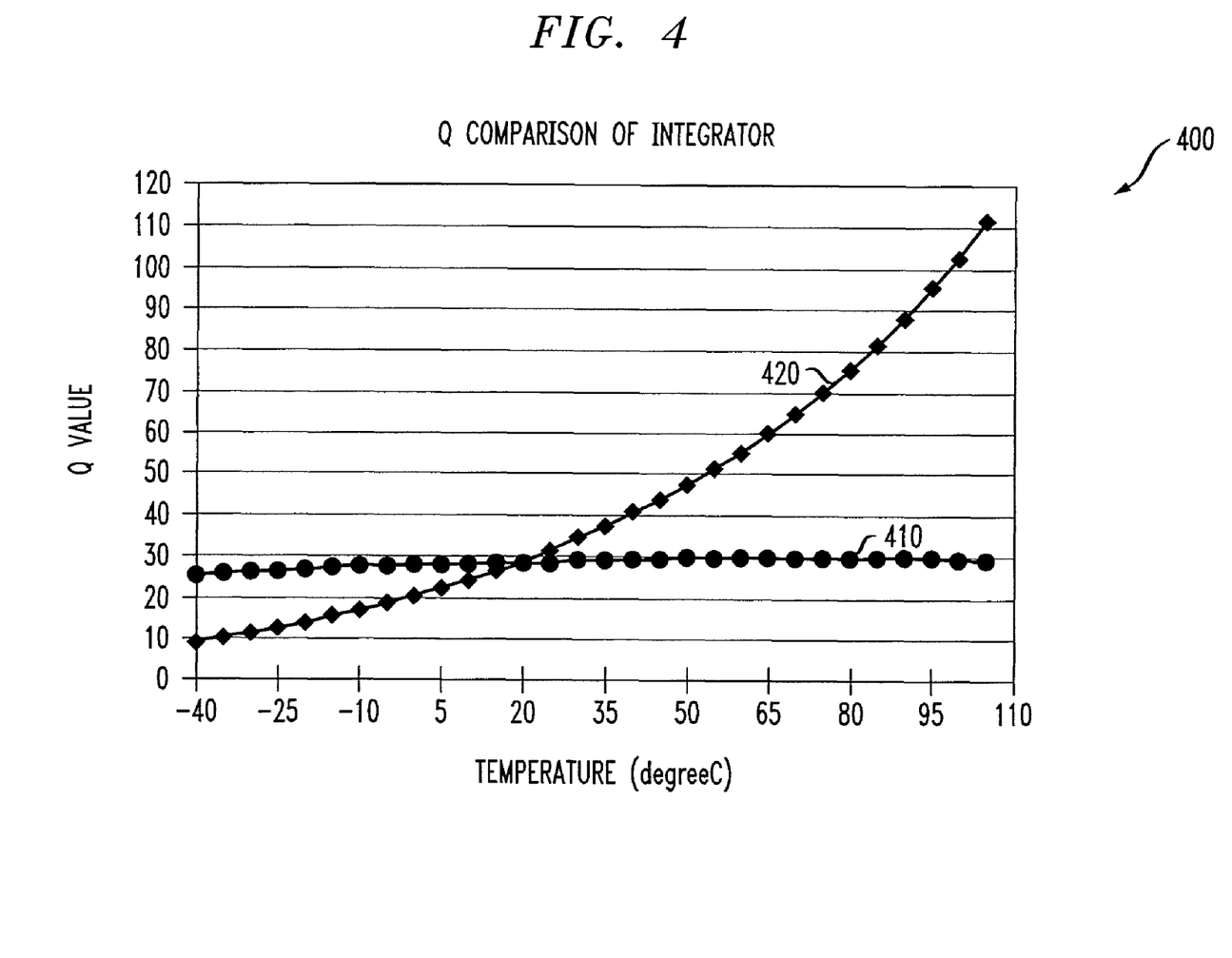
FIG. 4 illustrates a Q value versus temperature chart for the integrator embodiment shown in FIG. 2.

FIG. 4 is a Q value versus temperature chart 400 that illustrates Q values of a integrator 200 using a control circuit 235, such as that shown in FIG. 2. The data in the chart 400 is based on the data from chart 300 of FIG. 3 and calculated using Equation 2. Reference number 410 identifies the Q values of the integrator 200. These Q values vary from approximately 25 to 30. Reference number 420 identifies the Q values of the prior method using the digital-to-analog converter (DAC). These Q values vary from approximately 10 to 110. Based on chart 400, the integrator 200 can maintain a more consistent Q value with temperature variation using the control circuit 235 than the prior method.

Figure 5:
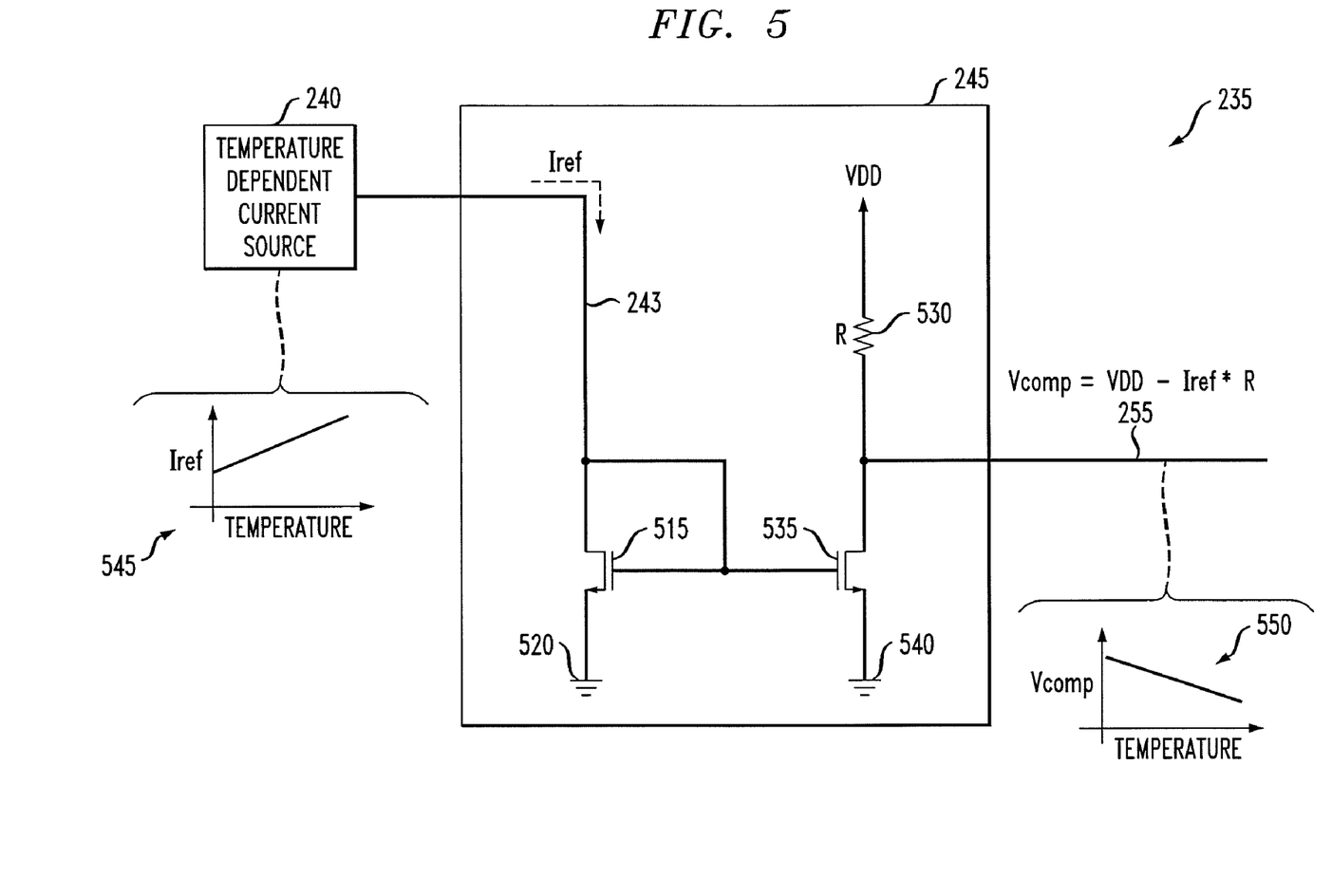
FIG. 5 is a schematic view that illustrates an embodiment of a current mirror circuit of a control circuit.

FIG. 5 is a schematic view that illustrates an embodiment of a current mirror circuit of a control circuit 235, such as that shown in FIG. 2. The temperature dependent current source 240 produces a reference current $I_{ref}$ that increases as the temperature increases, such as that shown in the reference current versus temperature chart 545. The current mirror circuit 245 receives the reference current $I_{ref}$ from the temperature dependent current source 240 and produces the voltage signal $V_{comp}$ based on the reference current. The voltage signal $V_{comp}$ decreases as temperature increases, which facilitates maintaining a constant resistance value of the NMOS transistor 250 (FIG. 2).

The current mirror circuit 245 includes a first NMOS transistor 515 that is coupled to the temperature dependent current source 240 at the drain and gate of the first NMOS transistor 515 at node 243. A resistor 530 is coupled between VDD and a second NMOS transistor 535. The gate and drain of the second NMOS transistor 535 are coupled to the temperature dependent current source 240 and the resistor 530 at nodes 243, 255, respectively. Both sources of the first and second NMOS transistors 515, 535 are coupled to a second potential (e.g., ground). Node 255 produces the voltage signal $V_{comp}$, which is calculated based on the following equation:

$$V_{comp} = VDD - (I_{ref} * R) \quad \text{(Eq. 5)}$$

where VDD, $I_{ref}$ and R refer to a voltage value from a voltage supply (not shown), the reference current from the temperature dependent current source 240 and the resistance value of the resistor 530, respectively.

Figure 6A:
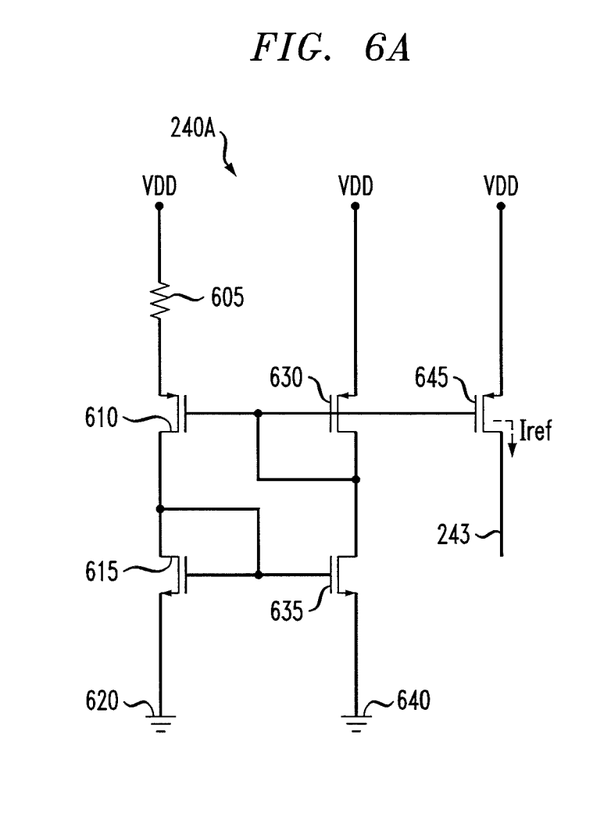
FIGS. 6A-B are schematic views that illustrate embodiments of a current source of a control circuit.
Figure 6B:
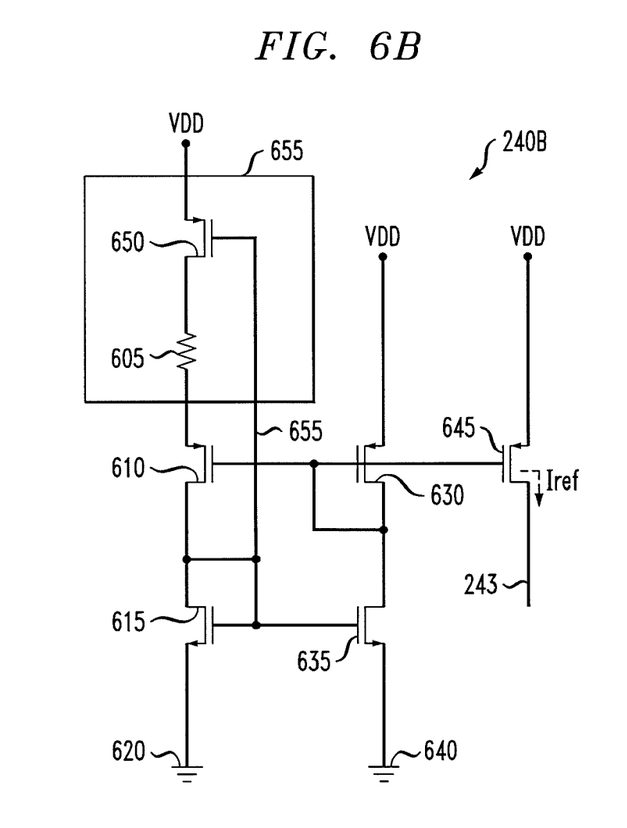

FIGS. 6A-B are schematic views that illustrate embodiments of a current source of a control circuit 235, such as that shown in FIG. 2. As mentioned above, the current sources 240A-B can produce a reference current $I_{ref}$ that increases as the temperature increases, such as that shown in the reference current versus temperature chart 545 (FIG. 5). Referring now to FIG. 6A, the temperature dependent current source 240A is a constant transconductance current source, which includes first and second NMOS transistors 615, 635, and first, second and third PMOS transistors 610, 630, 645. A resistor 605, the first NMOS transistor 615, and the second PMOS transistor 630 are electrically coupled at the source, drain and gate of the first PMOS transistor 610, respectively.

The first PMOS transistor 610 and the second NMOS transistor 635 are electrically coupled at the gate and drain of the second PMOS transistor 630, respectively. The gates of the first and second PMOS transistors 610, 630 and the drain of the second PMOS transistor 630 are coupled together at the same node. The first PMOS transistor 610 is coupled in series with the first NMOS transistor 615. The gates of the first and second NMOS transistors 615, 635 are coupled together. The first NMOS transistor 615 and the second PMOS transistor 630 are coupled to the gate and drain of the second NMOS transistor 635, respectively. Both sources of the first and second NMOS transistors 615, 635 are coupled to ground. The second PMOS transistor 630 and the node 243 are electrically coupled at the gate and drain of the third PMOS transistor 645, respectively. The reference current $I_{ref}$ can be passed to the current mirror circuit 245 (FIG. 2) at node 243.

The reference current $I_{ref}$ for the temperature dependent current source 240A can be determined using the following equation:

$$Iref = \frac{2}{\mu_P C_{OX}\left(\frac{W}{L}\right) * R^2}\left(1 - \frac{1}{\sqrt{2}}\right)^2 \quad \text{(Eq. 6)}$$

where R and $\mu_P C_{ox}$ (W/L) refer to the resistance value of the resistor 605 and mobility term of the temperature dependent current source 240A, respectively. The resistor 605 can be implemented in the semiconductor process as an OD resistor and sometimes, a polysilicon resistor or combinations of these resistors. Both the resistor 605 and the mobility term, $\mu_P C_{ox}$ (W/L), of the temperature dependent current source 240A have temperature dependencies. Because the temperature dependence of the resistor 605 is not balanced with the temperature dependence of the mobility term, the reference current also has a temperature dependency. The temperature dependent current source 240A is further described in connection with U.S. provisional patent application having Ser. No. 61/144,011, filed on Jan. 12, 2009, the entirety of which is hereby incorporated by reference herein.

Referring now to FIG. 6B, the temperature dependent current source 240B is a transconductance current source having a voltage controlled current circuit 650. The temperature dependent current source 240A (FIG. 6A) has a temperature dependency that affects the reference current. As such, the temperature dependent current source 240B includes a fourth PMOS transistor 650 that can adjust the reference current in correlation with the temperature dependent resistance value of the NMOS transistor 250 (FIG. 2).

The architecture of the temperature dependent current source 240B is similar to the architecture of the temperature dependent current source 240A. Accordingly, like features are labeled with the same reference numbers, such as the resistor 605, the first, second, and third PMOS transistors 610, 630, 645, and the first and second NMOS transistors 615, 635. The temperature dependent current source 240B, however, further includes the fourth PMOS transistor 650. The resistor 605 and the gates of the first and second NMOS transistors 615, 635 are coupled at the drain and gate of the fourth PMOS transistor 650, respectively.

The voltage at the gates of the first and second NMOS transistors 615, 635 and the fourth PMOS transistor 650 increases with temperature. As the voltage increases at the gate of the fourth PMOS transistor 650, the fourth PMOS transistor 650 conducts less current to the resistor 605; this corresponds to a reduction in resistance value of the resistance circuit 655. Based on Equation 6, the reference current of the temperature dependent current source 240B increases as the resistance value of the resistance circuit 655 decreases and correlates closely with the temperature dependent resistance value of the NMOS transistor 250 (FIG. 2). Thus, the temperature dependent current source 240B generally produces current values of the reference current that correlate more closely with the temperature dependent resistance value of the NMOS transistor 250 (FIG. 2) than the temperature dependent current source 240A (FIG. 6A), resulting in a more consistent resistance value of the NMOS transistor 250.

Figure 7:
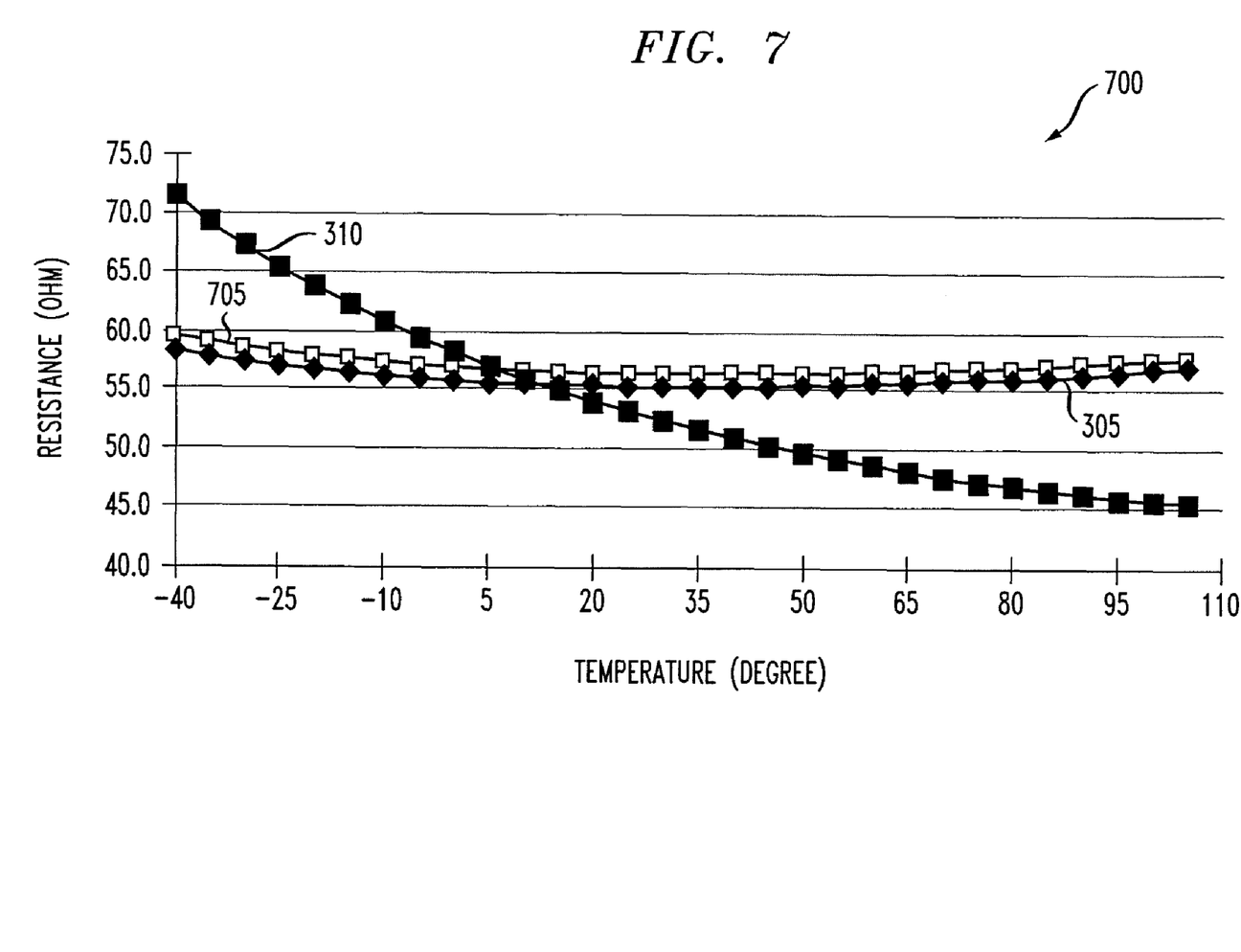
FIG. 7 is a resistance versus temperature chart that shows the effects of implementing the embodiments of the current sources of FIGS. 6A-B.

FIG. 7 is a resistance versus temperature chart 700 that shows the effects of implementing the embodiments of the current sources 240A-B, such as that shown in FIGS. 6A-B. The chart 700 is similar to chart 300 (FIG. 3). Accordingly, like resistance values are labeled with the same reference numbers, such as the ideal resistance values 305 and resistance values 310 using the constant transconductance current source 240A (FIG. 6A). The chart 700, however, further includes reference number 705, which identifies the resistance values using the temperature dependent current source 240B. These resistance values vary from approximately 52 to 60 ohms, which are closer to the ideal resistance values 305 than the resistance values 310 achieved using the temperature dependent current source 240A.

Figure 8:
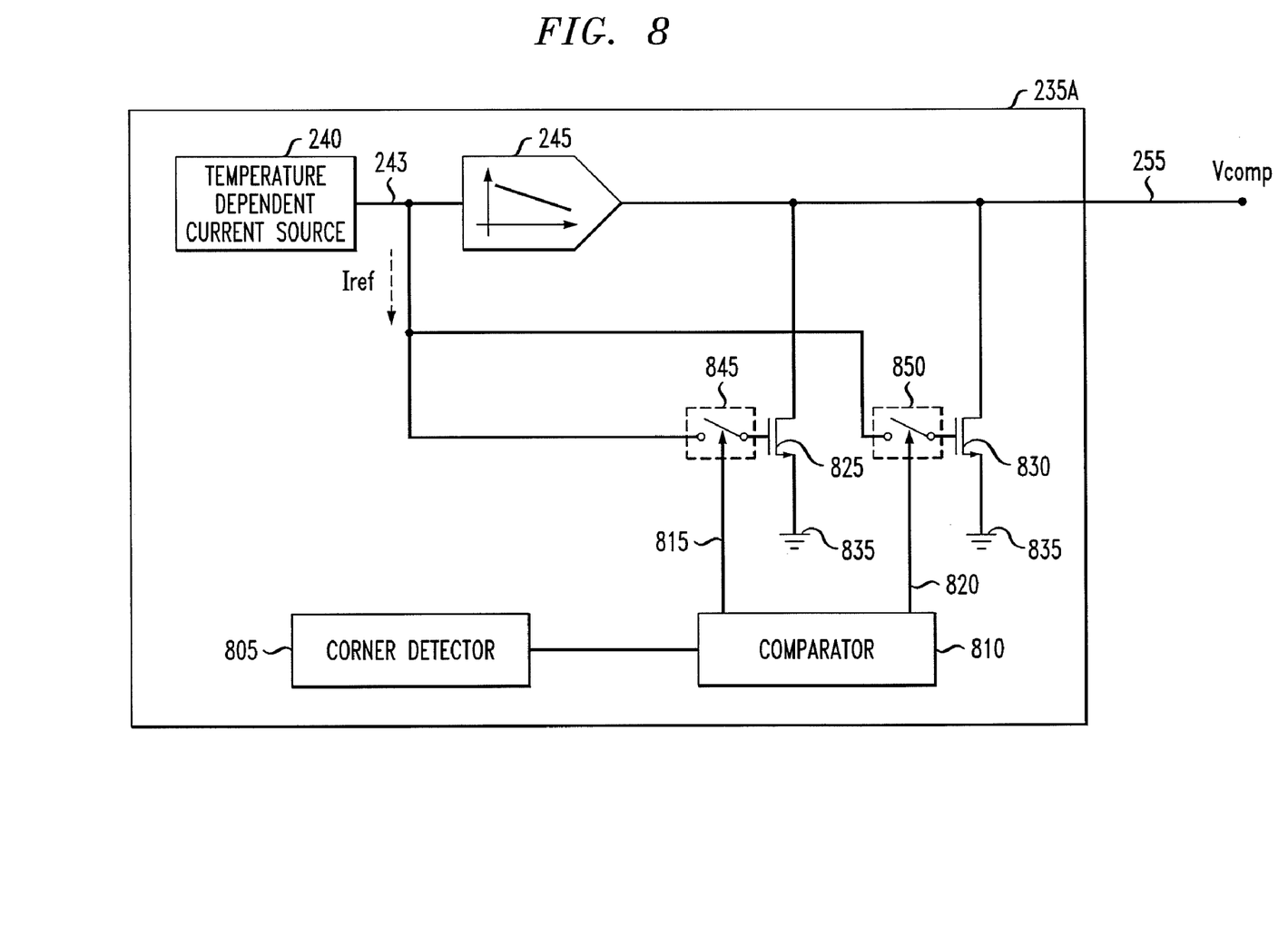
FIG. 8 is a diagram of an alternative embodiment of a temperature compensated circuit.

FIG. 8 is a block diagram that illustrates an alternative embodiment of control circuit 235A. Like control circuit 235, the control circuit 235A includes temperature dependent current source 240 and current mirror 245. The control circuit 235A includes a corner detector 805, NMOS transistors 825, 830 coupled in parallel to each other and a comparator 810. The drains and gates of the NMOS transistors 825, 830 are coupled to the node 255 ($V_{comp}$) and switches 845, 850, respectively. The sources of the NMOS transistors 825, 830 are coupled to ground 835. The corner detector 805 is electrically coupled to a comparator 810, which can turn on the NMOS transistors 825, 830 at lines 815, 820, respectively. The corner detector 805 can be a constant transconductance current source with temperature compensation that is further described in connection with U.S. provisional patent application having Ser. No. 61/144,011, filed on Jan. 12, 2009, the entirety of which is hereby incorporated by reference herein.

The corner detector 805 provides current that is independent of temperature. Rather, the current varies with process corners of the circuit fabrication. The process corners are variations from nominal doping concentrations (and other parameters) during the manufacturing of the circuit. Because the corner detector 805 produces current that varies with the process corners, the corner detector 805 can be used to detect, for example, typical-typical (TT), slow-slow (SS) and fast-fast (FF) corners, among other corners. The comparator 810 turns on the NMOS transistors 825, 830 by way of the switches 845, 850, respectively, based on the received current from the corner detector 805.

If either of the NMOS transistors 825, 830, or both, are turned on, the reference current at node 255 passes through the NMOS transistors 825, 830, resulting in lower voltage at node 255. The corner detector 805 can detect whether the integrator 200 is in, for example, the SS corner or FF corner. In the SS corner, higher voltage at the node 255 is desired. Thus, responsive to determining that the integrator 200 is in the SS corner, the comparator 810 turns off the NMOS transistors 825, 830. This prevents the reference current from passing through the NMOS transistors 825, 830 and $V_{comp}$ is maintained. In contrast, in the TT corner, lower voltage at the node 255 is desired. Thus, responsive to determining that the integrator 200 is in the TT corner, the comparator 810 turns on the NMOS transistors 825, 830. This enables the reference current to pass through the NMOS transistors 825, 830 and $V_{comp}$ is lowered.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as are suited to the particular use contemplated. All such modifications and variation are within the scope of this disclosure, as determined by the appended claims when interpreted in accordance with the breadth to which they are fairly and legally entitled.

What is claimed is:

1. An integrator comprising:
   an amplifier having an input and an output;
   a feedback loop coupled between the input and the output of the amplifier, the feedback loop comprising a compensated resistor circuit coupled in series with a capacitor and having a resistance value selected for reducing a loss factor of the integrator; and
   a control circuit coupled to an input of the compensated resistor circuit, the control circuit producing a control signal for controlling the compensated resistor circuit to substantially maintain the resistance value selected for reducing the loss factor of the integrator across a range of integrator temperatures.

2. The integrator of claim 1, wherein the control signal is a voltage signal that is dependent on the temperature of the integrator.

3. The integrator of claim 1, wherein the feedback loop further comprises a capacitance circuit electrically coupled in series with the compensated resistor circuit.

4. The integrator of claim 1, further comprising a resistor electrically coupled to the input of the amplifier.

5. The integrator of claim 1, wherein the control circuit is a negative temperature coefficient voltage generator (NTC-VG) circuit.

6. The integrator of claim 1, wherein the control circuit includes a current source that is electrically coupled to a current mirror circuit, wherein the current mirror circuit provides a temperature-dependent voltage signal for controlling the compensated resistor circuit.

7. The integrator of claim 6, wherein the current mirror circuit receives a reference current from the current source, wherein the temperature-dependent voltage signal decreases as the integrator temperature increases, and increases as the integrator temperature decreases, in response to the reference current from the current source.

8. The integrator of claim 6, wherein the current source includes a constant transconductance current source.

9. The integrator of claim 6, wherein the current source includes a transconductance current source having a voltage controlled current circuit.

10. The integrator of claim 6, further comprising a corner detector that detects a process corner of the integrator, wherein responsive to detecting the process corner of the integrator, the corner detector passes the detected corner to a comparator, which turns on or off a plurality of transistors, wherein the plurality of transistors passes current to ground if the plurality of transistors are turned on.

11. A electronic filter comprising:
    an amplifier having an input and an output;
    a feedback loop coupled between the input and the output of the amplifier, the feedback loop comprising a transistor having a resistance value selected for reducing a loss factor of the filter;
    a current mirror circuit coupled to an input of the transistor; and
    a current source coupled to an input of the current mirror circuit, the current source producing a reference current that changes as the filter temperature changes, wherein the current mirror circuit produces a voltage signal that changes based on the reference current from the current source to substantially maintain the resistance value selected for reducing the loss factor of the filter across a range of filter temperatures.

12. The electronic filter of claim 11, wherein the transistor includes an NMOS transistor having a channel resistance value that changes in response to the voltage signal from the current mirror circuit.

13. The electronic filter of claim 11, wherein the reference current increases as the filter temperature increases, and decreases as the filter temperature decreases.

14. The electronic filter of claim 13, wherein the voltage signal decreases as the filter temperature increases, and increases as the filter temperature decreases, in response to the reference current from the current source.

15. The electronic filter of claim 11, wherein the current source includes a constant transconductance current source.

16. The electronic filter of claim 11, wherein the current source includes a transconductance current source having a voltage controlled current circuit.

* * * * *